(12) United States Patent
Kim et al.

(10) Patent No.: US 8,466,452 B2
(45) Date of Patent: Jun. 18, 2013

(54) COLOR UNIT AND IMAGING DEVICE HAVING THE SAME

(75) Inventors: Kyu Sik Kim, Yongin-si (KR); Musubu Ichikawa, Ueda (JP); Yusuke Higashi, Nara (JP)

(73) Assignees: Samsung Electronics Co., Ltd. (KR); Shinshu University (JP)

( * ) Notice: Subject to any disclaimer, the term of this patent is extended or adjusted under 35 U.S.C. 154(b) by 609 days.

(21) Appl. No.: 12/689,566

(22) Filed: Jan. 19, 2010

(65) Prior Publication Data

US 2011/0001128 A1     Jan. 6, 2011

(30) Foreign Application Priority Data

Jul. 3, 2009    (KR) .................. 10-2009-0060802

(51) Int. Cl.
*H01L 51/46*   (2006.01)

(52) U.S. Cl.
USPC ...... 257/40; 257/432; 257/433; 257/E51.001; 257/E31.061; 257/E21.001

(58) Field of Classification Search
USPC .................. 257/40, 432, E31.061, E51.041, 257/E21.352
See application file for complete search history.

(56) References Cited

U.S. PATENT DOCUMENTS

| | | | |
|---|---|---|---|
| 6,300,612 B1 | 10/2001 | Yu | |
| 6,580,027 B2 | 6/2003 | Forrest et al. | |
| 7,915,701 B2 * | 3/2011 | Forrest et al. | 257/440 |
| 2005/0224905 A1 * | 10/2005 | Forrest et al. | 257/461 |
| 2007/0052051 A1 * | 3/2007 | Osaka et al. | 257/440 |
| 2009/0050881 A1 * | 2/2009 | Hayashi | 257/40 |
| 2009/0308458 A1 * | 12/2009 | Aramaki et al. | 136/263 |
| 2010/0282309 A1 * | 11/2010 | Pschirer et al. | 136/255 |
| 2010/0283039 A1 * | 11/2010 | Meng et al. | 257/40 |

FOREIGN PATENT DOCUMENTS

| | | |
|---|---|---|
| JP | 2004165516 | 6/2004 |
| JP | 2006228939 | 8/2006 |
| JP | 20086402 | 1/2008 |
| KR | 1020020066400 | 8/2002 |
| KR | 1020070058485 | 6/2007 |

* cited by examiner

*Primary Examiner* — Minh-Loan T Tran
*Assistant Examiner* — Fazli Erdem
(74) *Attorney, Agent, or Firm* — Cantor Colburn LLP

(57) ABSTRACT

A color unit is disclosed in which is included in an imaging device. The color unit includes; a first p-type electrode layer disposed on a light receiving side of the color unit, and including a light-absorptive organic material which selectively absorbs a wavelength other than a desired wavelength in a visible light band of the electromagnetic spectrum, a second p-type electrode layer disposed under the first p-type electrode layer and including a light-absorptive organic material which absorbs a desired wavelength and an n-type electrode layer disposed under the second p-type electrode layer and including an organic material, wherein photoelectric conversion is performed through a p-n junction between the second p-type electrode layer and the n-type electrode layer and light of the desired wavelength is converted into electrical current.

19 Claims, 6 Drawing Sheets

101

COLOR UNIT AND IMAGING DEVICE HAVING THE SAME

CROSS-REFERENCE TO RELATED APPLICATION

This application claims priority to Korean Patent Application No. 2009-0060802, filed on Jul. 3, 2009, and all the benefits accruing therefrom under 35 U.S.C. §119, the content of which in its entirety is herein incorporated by reference.

BACKGROUND

1. Field

The disclosures herein relate to a color unit, and an imaging device, such as a camera or an image sensor, having the color unit as a unit of a light receiving part thereof.

2. Description of Related Art

Light receiving devices are widely applied in digital cameras, broadcasting cameras, security cameras, computer video cameras, camcorders, automobile sensors, home sensors, solar cells and various other devices.

Generally, a light receiving device has a structure in which pixels are arranged, typically in a matrix-type of arrangement, and the pixels are basically composed of a microlens, a color filter and a photoelectric conversion device.

As competition to increase the number of pixels in order to obtain a high quality image grows, reduction in pixel size becomes an important issue. However, as the pixel size decreases, an amount of light reaching an optical diode of each pixel also decreases. This decreased amount of light degrades the performance of the light receiving device, for example, a decrease in light sensitivity, false-color images, a moiré phenomenon and a decrease in resolution are all possible effects of the reduced amount of light. A conventional pixel is difficult to form in a size of 1.4 μm or less.

A conventional metal oxide semiconductor ("MOS") capacitor or a p-n junction diode, which is formed of crystalline silicon, amorphous silicon or a compound semiconductor such as GaAs, is typically used as a photoelectric conversion device. However, this conventional photoelectric conversion device performs only a photoelectric conversion function, and thus includes separate color filters to select a light receiving region, thereby making it difficult to fabricate a device that is small in size and is highly-integrated.

SUMMARY

Accordingly, in one aspect, a color unit having an integrated function of both a photoelectric conversion device and a color filter is disclosed.

In one embodiment, the color unit includes; a first p-type electrode layer disposed on a light receiving side of the color unit, and including a light-absorptive organic material which selectively absorbing a wavelength other than a desired wavelength in a visible light band of the electromagnetic spectrum, a second p-type electrode layer disposed under the first p-type electrode layer and including a light-absorptive organic material which absorbs a desired wavelength, an n-type electrode layer disposed under the second p-type electrode layer and including an organic material, wherein photoelectric conversion is performed through a p-n junction between the second p-type electrode layer and the n-type electrode layer, and light of the desired wavelength is converted into electrical current.

In one embodiment the first p-type electrode layer may substantially serve as a color filter. For example, in one embodiment wherein the first p-type electrode layer may be formed of a light-absorptive organic material which selectively absorbs a light having a wavelength other than a wavelength in a red light region, the first p-type electrode may selectively transmit a wavelength in the red light region, thereby forming a red color unit. Likewise, in an embodiment wherein the first p-type electrode layer may be formed of a light-absorptive organic material which selectively absorbs a light having a wavelength other than a wavelength in a green light region, the first p-type electrode may form a green color unit, and when the first p-type electrode layer may be formed of a light-absorptive organic material which selectively absorbs a light having a wavelength other than a wavelength in a blue light region, the first p-type electrode may form a blue color unit.

In another aspect, an embodiment of an imaging device including the color unit as a component thereof is disclosed. Embodiments of the imaging device may include a charge coupled device ("CCD") imaging sensor or a complementary metal oxide semiconductor ("CMOS") imaging sensor.

In still another aspect, an embodiment of a method of fabricating a color unit is disclosed. Embodiments of the method include sequentially forming a first p-type electrode layer, an exciton blocking layer, a second p-type electrode layer and an n-type electrode layer by thermal evaporation.

Alternative embodiments of the method of fabricating a color unit include providing a first electrode layer, forming a hole transport layer via spin coating, sequentially forming a first p-type electrode layer, an exciton blocking layer, a second p-type electrode layer and an n-type electrode layer via thermal evaporation, and forming a second electrode layer.

BRIEF DESCRIPTION OF THE DRAWINGS

Embodiments are illustrated only with reference to the appended drawings. It should be understood that various aspects of the drawings may have been exaggerated for clarity.

DETAILED DESCRIPTION OF THE EMBODIMENTS

Figure 1:
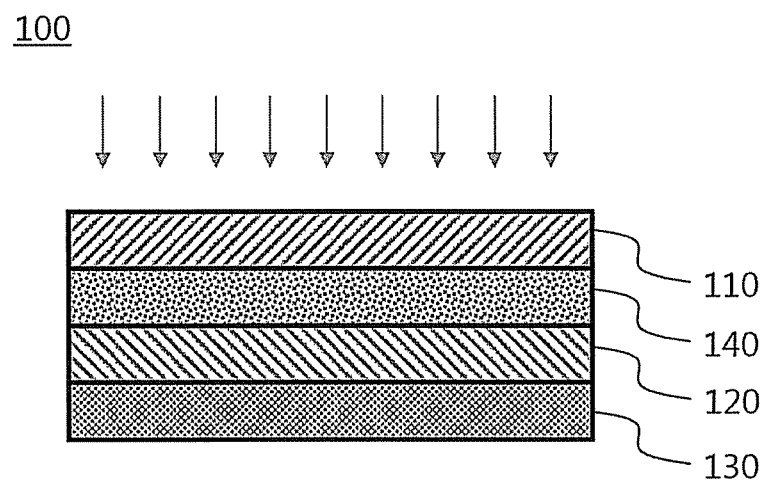
FIG. 1 is a cross-sectional view of one embodiment of the disclosed color unit.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

FIG. 1 is a cross-sectional view of one embodiment of the disclosed color unit 100.

Referring to FIG. 1, a first p-type electrode layer 110 is formed on a light receiving side of the color unit 100. A second p-type electrode layer 120 is formed under the first p-type electrode layer 110. An n-type electrode layer 130 is formed under the second p-type electrode layer 120.

Embodiments of the first p-type electrode layer 110 may be formed of a light-absorptive organic material capable of selectively absorbing a wavelength other than a desired wavelength in a visible light band of the electromagnetic spectrum. Accordingly, because light in a desired wavelength region may be selectively transmitted therethrough while other wavelengths may be absorbed thereby, the color unit 100 substantially functions as a color filter. Here, the selectively-absorbed wavelengths other than a desired wavelength describe, for example, that at least 50%, 60% or 70% of the selectively-absorbed wavelengths are outside of the desired wavelength range.

Embodiments of the second p-type electrode layer 120 may be formed of a light-absorptive organic material capable of absorbing a desired wavelength. The second p-type electrode layer 120 may be formed of, but is not limited to, any organic material capable of absorbing the desired wavelength. For example, embodiments of the organic material do not necessarily absorb only the desired wavelength, but can absorb any wavelength in the visible light region.

The second p-type electrode layer 120 may be in contact, e.g., direct contact, with the n-type electrode layer 130 which may be formed of an organic material, thereby making a p-n junction. Accordingly, photoelectric conversion may occur at the p-n junction. The color unit 100 according to the present embodiment has a structure in which photoelectric conversion and color filter functions are integrated. In addition, all of the first p-type electrode layer 110, the second p-type electrode layer 120 and the n-type electrode layer 130 are formed of organic materials and are stacked, and thus the size of the color unit is easy to control.

Accordingly, as the number of pixels substantially increases, so that an imaging device including the embodiment of a color unit 100 as a component thereof can provide a high quality image. Further, as all the electrode layers are formed of an organic material, the electrode layers may be formed by deposition in a continuous process, resulting in reduced production costs.

In the color unit, the first p-type electrode layer 110 and the second p-type electrode layer 120 may have a band gap energy ranging from about 2.0 eV to about 3.5 eV to generate excitons when visible light is applied thereto. The excitons are generated in the first and second p-type electrode layers 110 and 120 due to the incident light (illustrated as arrows in FIG. 1) received from the light receiving side, and the first p-type electrode layer 110 may selectively absorb light having a wavelength other than the desired wavelength. Thus, the light having the desired wavelength is incident to the second p-type electrode layer 120.

Because the first p-type electrode layer 110 may selectively absorb a wavelength other than the desired wavelength in the visible light region, a color of light received at the second p-type electrode layer 120 and n-type electrode layer 130 may be dependant on the wavelength absorbed by the light-absorptive organic material of the first p-type electrode layer 110. Thus, various color units may be constructed using different materials for the first p-type electrode layer 110.

For example, red, green or blue color units may be fabricated respectively as follows:

(i) a red color unit including a first p-type electrode layer (functioning as a red light filter) formed of a light-absorptive organic material capable of selectively absorbing a wavelength other than those wavelengths corresponding to a red light region, e.g., about 600 nm to about 780 nm;

(ii) a green color unit including a first p-type electrode layer (functioning as a green light filter) formed of a light-absorptive organic material capable of selectively absorbing a wavelength other than those wavelengths corresponding to a green light region, e.g., about 500 nm to about 600 nm; or (iii) a blue color unit including a first p-type electrode layer (functioning as a blue light filter) formed of a light-absorptive organic material capable of selectively absorbing a wavelength other than those wavelengths corresponding to a blue light region, e.g., about 450 nm to about 500 nm.

As described above, the red light region has a wavelength ranging from about 600 nm to about 780 nm and a band gap energy ranging from about 2.0 eV to about 2.2 eV. The green light region has a wavelength ranging from about 500 nm to about 600 nm and a band gap energy ranging from about 2.4 eV to about 2.5 eV. The blue light region has a wavelength ranging from about 450 nm to about 500 nm and a band gap energy ranging from about 3.1 eV to about 3.2 eV.

When the transfer of the excitons generated in the first p-type electrode layer 110 to the second p-type electrode layer 120 is inhibited, selectivity of the desired wavelength may be further improved. Accordingly, an exciton blocking layer 140 capable of preventing the transfer of the excitons may be formed under the first p-type electrode layer 110.

For example, in one embodiment the exciton blocking layer 140, as shown in FIG. 1, may be formed between the first p-type electrode layer 110 and the second p-type electrode layer 120. For example, in one embodiment the exciton blocking layer 140 may be formed of a light-absorptive organic material capable of selectively absorbing a wavelength other than the desired wavelength, similar to the properties described with respect to the first p-type electrode layer 110.

A method of blocking the transfer of the excitons in the exciton blocking layer 140 is not particularly limited. For example, embodiments of the exciton blocking layer 140 may have a larger band gap energy than the first p-type electrode layer 110. In this case, since the energy of the excitons generated in the first p-type electrode layer 110 is lower than the band gap energy of the exciton blocking layer 140, electrons cannot be transferred across the boundary between the first p-type electrode layer 110 and the exciton blocking layer 140.

The band gap energy of the exciton blocking layer 140 may be larger than that of the first p-type electrode layer 110 by at least about 0.1 eV, and in one embodiment from about 0.1 eV to about 0.3 eV.

Examples of the exciton blocking layer 140 may include layers for red, green and blue light as follows:

(a) an exciton blocking layer for red light which blocks a wavelength of less than about 600 nm;

(b) an exciton blocking layer for green light which blocks a wavelength of less than about 500 nm; and (c) an exciton blocking layer for blue light which blocks a wavelength of less than about 400 nm.

The first p-type electrode layer 110 for red light or the exciton blocking layer 140 for red light may be formed of one of a number of oligothiophene derivatives.

Among the oligothiophene derivatives, phenyl hexathiophene ("P6T") of Formula (1) may selectively absorb a blue light wavelength of about 400 nm to about 500 nm, which has the band gap energy of about 2.1 eV. Accordingly, it may be suitable for the first p-type electrode layer 110 for red light.

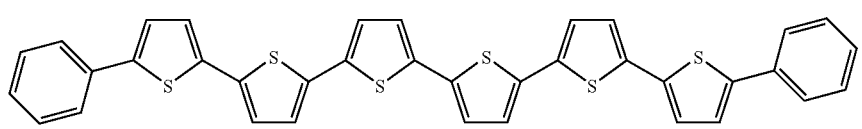

Formula (1)

Among the oligothiophene derivatives, biphenyl-trithiophene ("BP3T") may effectively block a blue light wavelength ranging from about 400 nm to about 500 nm. In addition, the band gap energy is about 2.3 eV, which is higher than that of P6T by about 0.2 eV, and thus it may be suitable for the exciton blocking layer 140 for red light.

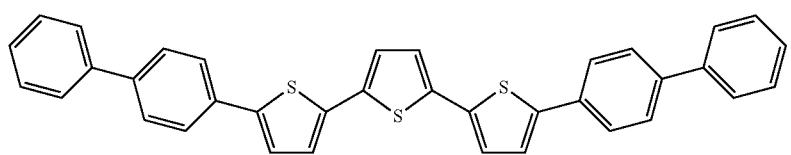

Formula (2)

The second p-type electrode layer 120 may be formed of a semiconductor material in which holes serve as a plurality of charge carriers therein. Organic materials suitable for the p-type electrode layers may include phthalocyanine derivatives. For example, in one embodiment the second p-type electrode layer 120 may be formed of copper phthalocyanine (CuPc) as a light-absorptive organic material, which is capable of absorbing a wavelength in the entire visible light region.

The n-type electrode layer 130 may be formed of a semiconductor organic material in which electrons serve as a plurality of charge carriers therein. For example, in one embodiment the n-type electrode layer 130 may be formed of $C_{60}$ fullerene carbon.

In one embodiment the red color unit may be formed in a stacked structure of the first p-type electrode layer 110 formed of P6T, the exciton blocking layer 140 formed of BP3T, the second p-type electrode layer 120 formed of CuPc, and the n-type electrode layer 130 formed of $C_{60}$.

Figure 2:
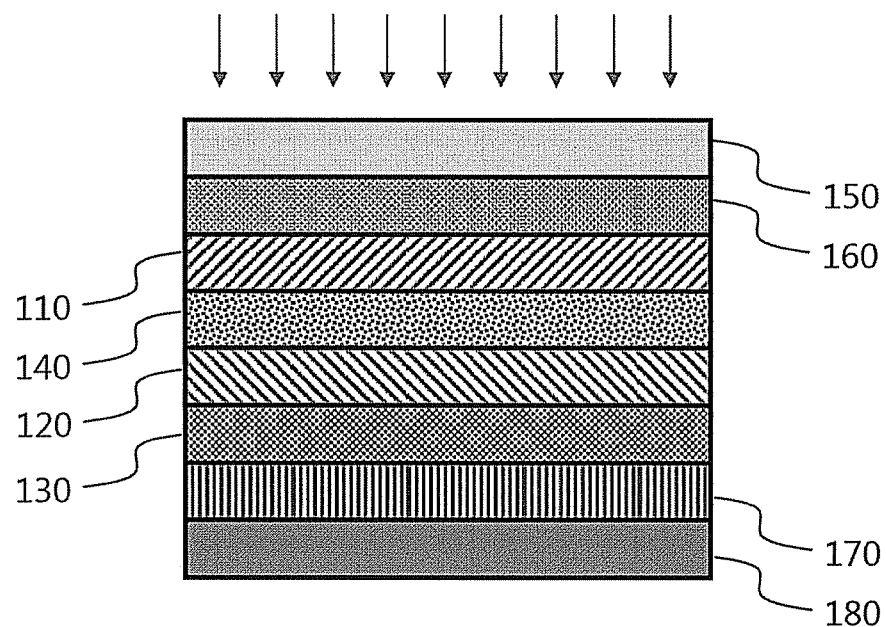
FIG. 2 is a cross-sectional view of another embodiment of the disclosed color unit.

The color unit according to the embodiment may further include various electrode layers, a buffer layer or an intrinsic layer if desired. FIG. 2 is a cross-sectional view of another embodiment of a color unit 101. The color unit 101 will be described in detail with reference to FIG. 2 below. For convenience, in FIG. 2, like reference numerals denote like parts similar to the embodiment of FIG. 1.

In some cases, the present embodiment of a color unit 101 may further include at least one selected from the following layers:

a first electrode layer 150 formed on the first p-type electrode layer 110;

a hole transport layer 160 formed between the first electrode layer 150 and the first p-type electrode layer 110;

a second electrode layer 180 formed under the n-type electrode layer 130; and a buffer layer 170 formed between the n-type electrode layer 130 and the second electrode layer 180.

In one embodiment, the color unit 101 may be formed in a sequentially-stacked structure of the first electrode layer 150, the hole transport layer 160, the first p-type electrode layer 110, the exciton blocking layer 140, the second p-type electrode layer 120, the n-type electrode layer 130, the buffer layer 170 and the second electrode layer 180 from a light receiving side, wherein the incident light is illustrated as a series of arrows, as shown in FIG. 2.

In another embodiment, the color unit 101 may further include an intrinsic layer (not shown) formed by co-depositing a p-type organic material and an n-type organic material between the second p-type electrode layer 120 and the n-type electrode layer 130.

In such an embodiment, for example, the color unit 101 may be formed in a sequentially-stacked structure of the first electrode layer 150, the hole transport layer 160, the first p-type electrode layer 110, the exciton blocking layer 140, the second p-type electrode layer 120, the intrinsic layer (not shown), the n-type electrode layer 130, the buffer layer 170 and the second electrode layer 180.

In the sequentially-stacked structure, each layer may have a variety of thickness. For example, the thickness of the hole transport layer 160 may be about 5~100 nm or about 20~50 nm, that of the first p-type electrode layer 110 may be about 50~300 nm, or about 80~250 nm. The thickness of the exciton blocking layer 140, the second p-type electrode layer 120, the intrinsic layer (not shown), and the n-type electrode layer 130 may be about 5~50 nm, respectively, that of the buffer layer 170 may be about 1~20 nm, and that of the first electrode layer 150 or the second electrode layer 180 may be about 10~300 nm, respectively. In case that the intrinsic layer is disposed between the second p-type electrode layer 120 and the n-type electrode layer 130 (i.e., PIN stacked structure), the thickness of the first p-type electrode layer 110 may be greater as compared that the intrinsic layer is not disposed.

In the color unit 101 having such a stacked structure, when a negative voltage is applied to a first electrode, e.g., the first electrode layer 150 or a layer connected to the first electrode layer 150, a positive voltage is applied to a second electrode, e.g., the second electrode layer 180 or a layer connected to the second electrode layer 180, and light is incident to a light receiving side on the first electrode layer 150, excitons, which are pairs of electrons and holes, are generated in the color unit 101. A large number of the excitons are generated in the second p-type electrode layer 120, and electrons are transferred to the second electrode layer 180 through the n-type electrode layer 130 and the buffer layer 170. Thus, current may be generated and photons may be generated in a desired wavelength region.

The first and second electrode layers 150 and 180 may be transparent electrodes, and, for example, in some embodiments may be formed of one selected from the group consisting of indium tin oxide ("ITO"), indium zinc oxide ("IZO"), ZnO, SnO$_2$, antimony-doped tin oxide ("ATO"), Al-doped zinc oxide ("AZO"), gallium-doped zinc oxide ("GZO"), TiO$_2$ and fluorine-doped tin oxide ("FTO") and other materials with similar characteristics. Alternative embodiments include configurations wherein the second electrode layer 180 may be a metal electrode which is formed of one selected from the group consisting of Al, Cu, Ti, Au, Pt, Ag and Cr.

In one embodiment, the hole transport layer 160 may be formed of polyethylene dioxythiophene/polystyrenesulfonic acid ("PEDOT/PSS"), but the inventive concept is not limited thereto. In one embodiment, the buffer layer 170 may be formed of 2,9-dimethyl-4,7-dipheny-1,10-phenanthroline ("bathocuproin; BCP").

In the intrinsic layer, a p-type organic material may be the same as or different from the material for the second p-type electrode layer 120. Likewise, an n-type organic material may be the same as or different from the material for the n-type electrode layer 130. For example, in one embodiment the intrinsic layer may be formed by co-depositing CuPc as the p-type organic material and C$_{60}$ as the n-type organic material, but the inventive concept is not limited thereto.

In one example embodiment, the red color unit may include the first electrode layer 150 formed of ITO, the hole transport layer 160 formed of PEDOT:PSS, the first p-type electrode layer 110 formed of P6T, the exciton blocking layer 140 formed of BP3T, the second p-type electrode layer 120 formed of CuPc, the n-type electrode layer 130 formed of C$_{60}$, the buffer layer 170 formed of BCP and the second electrode layer 180 formed of Al.

In another example embodiment, the red color unit may include the first electrode layer 150 formed of ITO, the hole transport layer 160 formed of PEDOT:PSS, the first p-type electrode layer 110 formed of P6T, the exciton blocking layer 140 formed of PB3T, the second p-type electrode layer 120 formed of CuPc, the intrinsic layer formed by co-depositing CuPc and C$_{60}$, the n-type electrode layer 130 formed of C$_{60}$, the buffer layer formed of BCP and the second electrode layer 180 formed of Al.

An embodiment of a method of fabricating the color may include sequentially forming a first p-type electrode layer 110, an exciton blocking layer 140, a second p-type electrode layer 120 and an n-type electrode layer 130 using thermal evaporation.

Another embodiment of a method of fabricating a color unit may include forming a first electrode 150. The method may also include forming a hole transport layer 160 using spin coating. The method may further include sequentially forming a first p-type electrode layer 110, an exciton blocking layer 140, a second p-type electrode layer 120 and an n-type electrode layer 130 using thermal evaporation, similar to that described above. The method may still further include forming a buffer layer 170 on the n-type electrode layer 130 and forming a second electrode layer 180 on the buffer layer 170.

In the above described embodiments of a method of fabricating a color unit, the first p-type electrode layer 110, the exciton blocking layer 140 and the n-type electrode layer 130 may be formed by thermal evaporation, which can make the manufacturing process thereof easy and simple and thereby reduce a production time associated with the color unit. Thus, this method may provide good process efficiency.

In some embodiments of the method, after forming the second p-type electrode layer 120, an intrinsic layer may be further formed before forming the n-type electrode layer 130, as described in detail above.

An imaging device according to one embodiment has the color unit as a unit of a light receiving part thereof. Examples of the imaging devices may include a charge coupled device ("CCD") image sensor or a complementary metal oxide semiconductor ("CMOS") image sensor or various other similar devices. The CMOS image sensor may include a power controller controlling power, a CMOS of a light receiving part receiving power supplied from the power controller and generating an electrical signal due to received light, and a CMOS of an output part outputting the signal received from the CMOS of the light receiving part.

A conventional light receiving part uses red, green and blue color unit pixels, which are independently formed and arranged, and thus pixel size is difficult to control. The present image sensor, however, includes a color unit formed of an organic material and performs photoelectric conversion and color filter functions as a unit of a light receiving part. Thus, the image sensor is operated in an organic photoelectric conversion method.

Accordingly, the image sensor does not use a combination of a separate color filter and a photodiode, and easily controls its size, and the unit of a light receiving part is formed in a stacked structure, so that it is preferable for fabricating a small or large-sized image sensor. In addition, many problems generated when conventional color filter pixels are used, for example, a decrease in sensitivity, false-color images, a moiré phenomenon and a decrease in resolution, can be reduced or effectively prevented.

Figure 3:
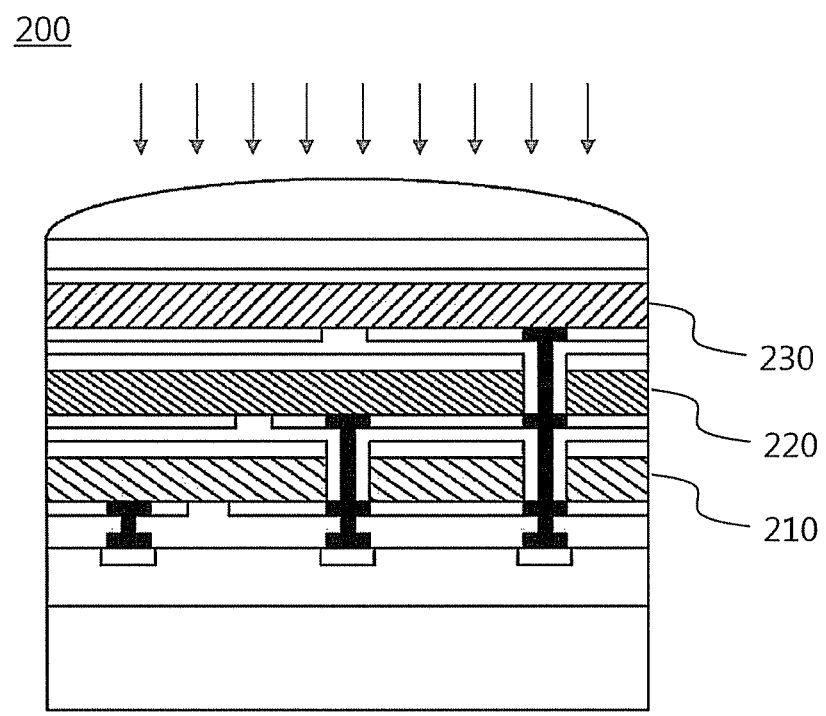
FIG. 3 is a schematic diagram of an embodiment of a light receiving part including an embodiment of the color unit.

FIG. 3 is a schematic diagram of an embodiment of a light receiving part 200. Referring to FIG. 3, the light receiving part 200 may include a blue color unit 230, a green color unit 220 and a red color unit 210, which are sequentially stacked from a light receiving side of the light receiving part, wherein the series of arrows illustrates incident light.

However, the blue, green and red color units 230, 220 and 210 of the light receiving part 200 are not all necessarily embodiments of color units as disclosed above. For example, in one embodiment if the red color unit 210 according to the disclosed embodiment is included, the green or blue color unit 220 or 230 may be formed of a known inorganic semiconductor compound, respectively.

To be specific, an image sensor including a red color unit operating in an organic photoelectric conversion methodology, a silicon-based green color unit, and a silicon-based blue color unit, and an image sensor including a red color unit operating in the organic photoelectric conversion methodology, a silicon-based green color unit, and a blue color unit operating in the organic photoelectric conversion methodology may also be included in the scope of the inventive concept.

The color unit operating in the organic photoelectric conversion methodology may be formed by stacking the following layers:

1) a first electrode layer 150 formed at a light receiving side and formed of one selected from the group consisting of ITO, TZO, ZnO, SnO2, ATO, AZO, GZO, TiO2 and FTO;

2) a first p-type electrode layer 110 formed under the first electrode layer 150, and formed of a light-absorptive organic material capable of selectively absorbing a wavelength other than a desired wavelength in a visible light region;

3) an exciton blocking layer 140 blocking the transfer of excitons generated in the first p-type electrode layer 110 between the first p-type electrode layer 110 and a second p-type electrode layer 120;

4) a second p-type electrode layer 120 formed under the first p-type electrode layer 110, and capable of absorbing a desired wavelength;

5) an n-type electrode layer 130 formed under the second p-type electrode layer 120; and 6) a second electrode layer 180 disposed on a substrate and formed of one selected from the group consisting of ITO, IZO, ZnO, SnO2, ATO, AZO, GZO, TiO2, FTO, Al, Cu, Ti, Au, Pt, Ag and Cr.

The color unit may further include 7) a hole transport layer 160 formed of PEDOT:PSS between the first electrode layer 150 and the first p-type electrode layer 110, 8) a buffer layer 170 formed of BCP between the n-type electrode layer 130 and the second electrode layer 180 or 9) an intrinsic layer formed by co-depositing a p-type organic material and an n-type organic material between the second p-type electrode layer 120 and the n-type electrode layer 130. The intrinsic layer may be formed by co-depositing CuPc and C60.

The image sensor may be used in various applications, for example, digital cameras, broadcasting cameras, security cameras, computer video cameras, camcorders, automobile sensors, home sensors, computer video phones, solar cells and various other similar devices.

The disclosed color unit functions as a photoelectric conversion device, which can also be suitable for an organic thin film solar cell. In addition, the color unit is formed of an organic material, and thus can be fabricated in a continuous process during deposition of a thin film of the organic thin film solar cell.

The following experimental and comparative examples are provided to illustrate features of the color unit.

EXAMPLE 1

An ITO glass was washed with water/ultrasonic waves and methanol and acetone, and treated with $O_2$ plasma. A PEDOT:PSS layer was formed on the ITO glass to have a thickness of about 35 nm using spin coating. Subsequently, 100 nm-thick P6T, 15 nm-thick BP3T, 25 nm-thick CuPc, 35 nm-thick $C_{60}$, and 6 nm-thick BCP layers were sequentially deposited at a rate of about 1 Å/s under a pressure of about $1 \times 10^{-7}$ torr using thermal evaporation. A 150 nm-thick Al layer was deposited as an electrode on the CuPc layer at a rate of about 5 Å/s, and thus a color unit was completed in a stacked structure of ITO, PEDOT:PSS, P6T, BP3T, CuPc, $C_{60}$, BCP and Al layers.

EXAMPLE 2

A color unit was fabricated by substantially the same method as described in Example 1, except that the P6T layer was omitted.

COMPARATIVE EXAMPLE 1

A color unit is fabricated by substantially the same method as described in Example 1, except that the P6T and BP3T layers were omitted.

EXPERIMENTAL EXAMPLE 1

Measurement of IPCE

Figure 4:
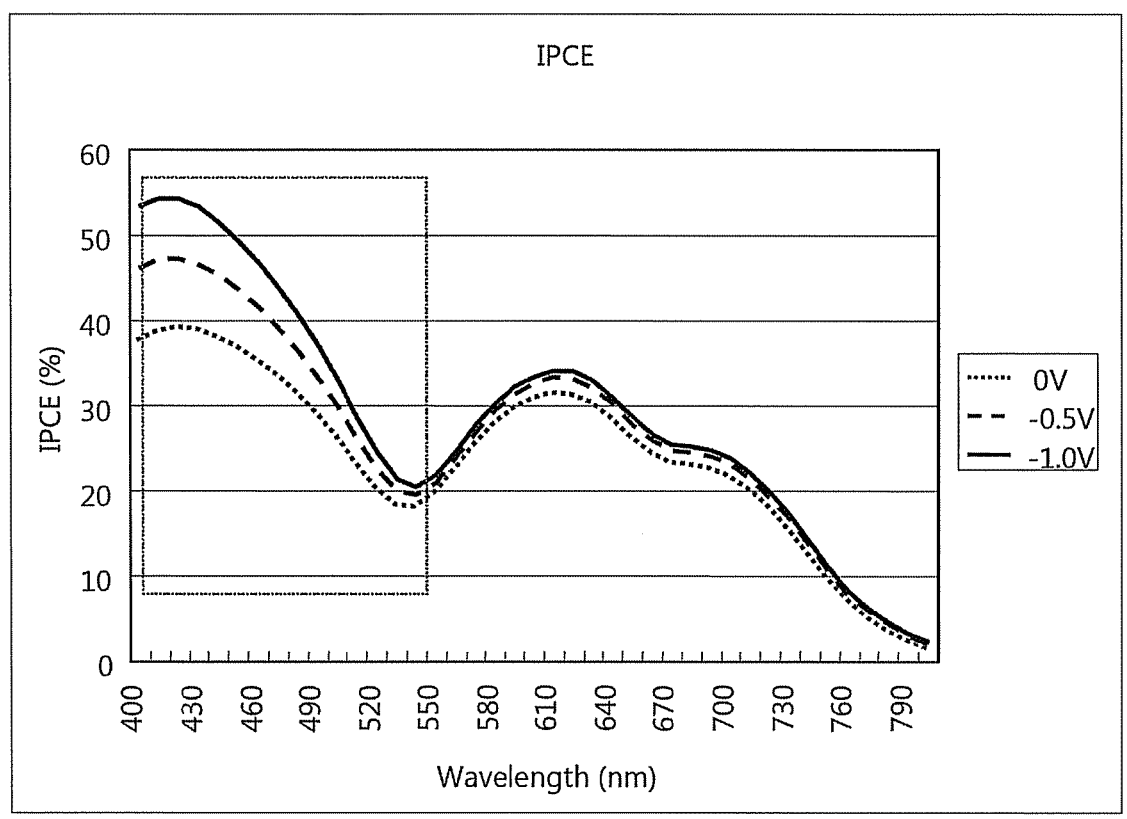
FIG. 4 is a graph that shows incident photon-current conversion efficiency ("IPCE") values of a color unit manufactured in Comparative example 1, which are measured in Experimental example 1, wherein the x-axis corresponds to wavelength, and the y-axis corresponds to the IPCE value.
Figure 5:
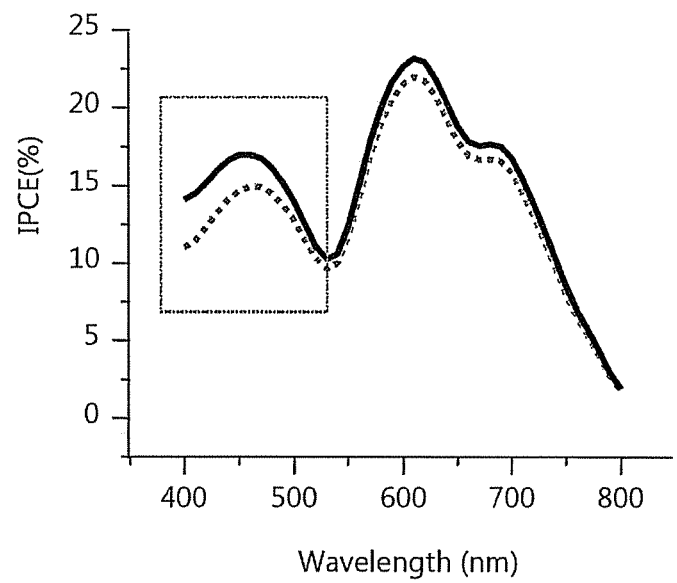
FIG. 5 is a graph that shows IPCE values of a color unit manufactured in Example 2, which are measured in Experimental example 1, wherein the x-axis corresponds to wavelength, and the y-axis corresponds to the IPCE value, wherein the dotted line corresponds to a result obtained when a voltage is 1 V, and the solid line corresponds to a result obtained when a bias is not applied and a voltage is 0 V.
Figure 6:
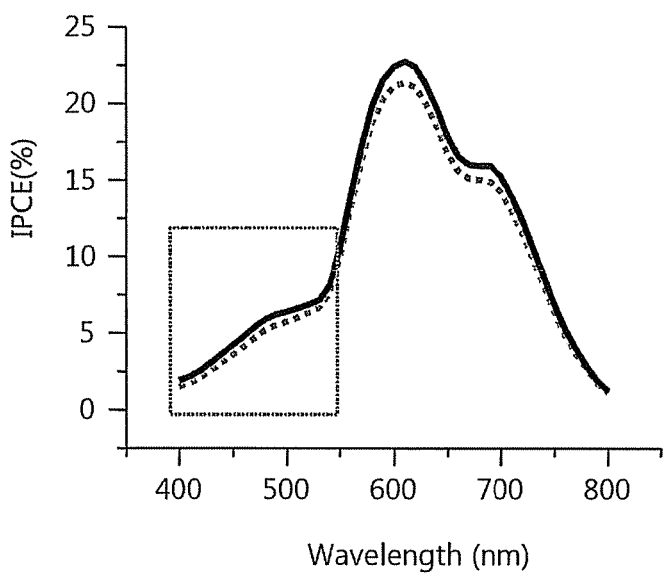
FIG. 6 is a graph that shows IPCE values of a color unit manufactured in Example 1, which are measured in Experimental example 1, wherein the x-axis corresponds to wavelength, and the y-axis corresponds to IPCE value, wherein the dotted line corresponds to a result obtained when a voltage is 1 V, and the solid line corresponds to a result obtained when a bias is not applied and a voltage is 0 V.

Monochromatic lights are sequentially applied at each wavelength of visible light to color units fabricated in Examples 1 and 2 and Comparative example 1. The monochromatic lights are applied to the ITO layer from above. Incident photon to current efficiency ("IPCE") is measured for each wavelength of light, and the result is shown in FIGS. 4 to 6. The measurements of comparative example 1 are illustrated in FIG. 4, the measurements of example 2 are illustrated in FIG. 5, and the measurements of example 1 are illustrated in FIG. 6. To provide monochromic light, a Xenon lamp or a monochrometer was used, and a function generator (specifically a Hokudo Denko, Ltd., HB-104) was also used.

Referring to FIGS. 4 to 6, in Example 2 in which the first p-type electrode layer (the BP3T layer) is formed according to the embodiments described above, the IPCE is significantly decreased in the range of about 400 nm to about 550 nm, compared to Comparative example 1. In Example 1 in which the exciton blocking layer (the P6T layer) is formed under the first p-type electrode layer, it can be confirmed that TPCE is less than 10% in the range of about 400 nm to about 550 nm. This is because the transfer of excitons generated at the P6T layer (band gap:about 2.1 eV) is inhibited by the BP3T layer (band gap:about 2.3 eV). Essentially, as described above, the formation in Example 2 of the first p-type electrode layer (the BP3T layer) formed according to the embodiments described above significantly decreases the IPCE of photons in the 400 nm to 550 nm band, while the additional formation of the exciton blocking layer (the P6T layer) further decreases the IPCE of photons in the 400 nm to 550 nm band.

EXPERIMENTAL EXAMPLE 2

Measurement of Absorbance

A 100 nm-thick P6T film was formed at a rate of about 1 Å/s under about $1 \times 10^{-7}$ torr using thermal evaporation. Under the same conditions, a 100 nm-thick BP3T film was also formed. Subsequently, absorbances of these films were measured using a UV-visible spectrometer in the visible light region, and the result is shown in FIG. 7.

Figure 7:
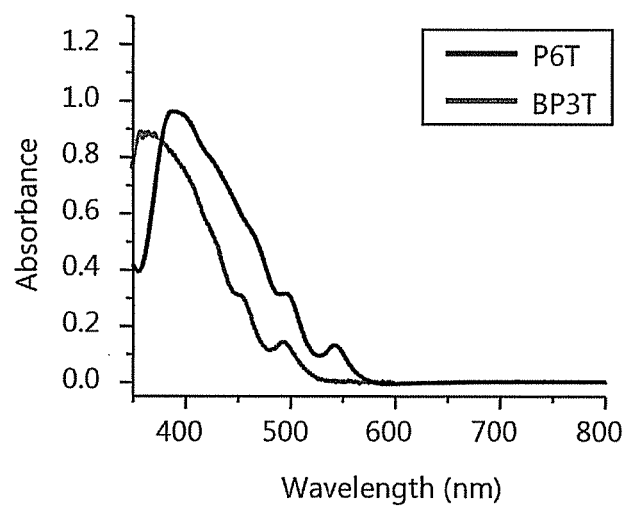
FIG. 7 is a graph of absorbance according to Experimental example 2.

Referring to FIG. 7, the BP3T and P6T films have high absorbance in the range of about 400 nm to about 550 nm, and therefore these films can selectively transmit red light in the range of about 600 nm to about 780 nm.

Consequently, color units according to embodiments have integrated functions as a photoelectric conversion device and a color filter, and thus their sizes are easy to control and the color units are also easy to fabricate. Accordingly, an imaging device such as a CMOS image sensor including the color units as units of a light receiving device can stably sense images and easily control spaces between the color units, so that it can be easily fabricated in a small size. Thus, the color units and the imaging device including the same are very efficient in both economical and industrial aspects.

EXAMPLE 3

A color unit is fabricated by substantially the same method as described in Example 1, except that 100 nm-thick P6T, 20 nm-thick BP3T, 10 nm-thick CuPc, 30 nm-thick CuPc:$C_{60}$ (1:1), 20 nm-thick $C_{60}$, and 6 nm-thick BCP layers were sequentially deposited, and thus a color unit was completed in a stacked structure of ITO, PEDOT:PSS, P6T, BP3T, CuPc, CuPc:$C_{60}$, $C_{60}$, BCP and Al layers.

EXAMPLE 3

A color unit is fabricated by substantially the same method as described in Example 3, except that 200 nm-thick P6T layer was deposited, and thus a color unit was completed in a stacked structure of ITO, PEDOT:PSS, P6T, BP3T, CuPc, CuPc:$C_{60}$, $C_{60}$, BCP and Al layers.

EXPERIMENTAL EXAMPLE 3

Measurement of IPCE

Figure 8:
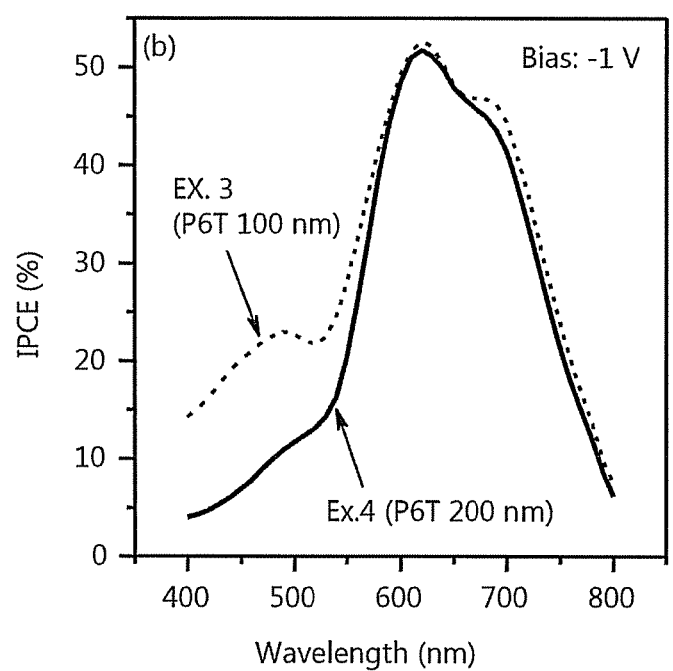
FIG. 8 is a graph that shows IPCE values of a color unit manufactured in Example 3 and 4, which are measured in Experimental example 3, wherein the x-axis corresponds to wavelength, and the y-axis corresponds to IPCE value, wherein the dotted line corresponds to a result of Example 3, and the solid line corresponds of Example 4.

Incident photon to current efficiency ("IPCE") is measured for each wavelength of light by substantially the same method as described in Experimental example 1, and the result is shown in FIG. 8.

Referring to FIG. 8, in Example 3 in which the intrinsic layer (the CuPc:$C_{60}$ layer) and 100 nm-thick of the exciton blocking layer(the. P6T layer) are formed according to the embodiments described above, the IPCE is significantly decreased in the range of about 400 nm to about 550 nm, compared to Comparative example 1 (see FIG. 4). In Example 4 in which the intrinsic layer (the CuPc:$C_{60}$ layer) and 200 nm-thick of the exciton blocking layer(the P6T layer) are formed, it can be confirmed that IPCE is less than 10% in the range of about 400 nm to about 550 nm. Further, in Examples 3 and 4 in which the intrinsic layer (the CuPc:$C_{60}$ layer) are formed, the value of IPCE is 50% and more in the range of about 600~700 nm.

While embodiments have been disclosed herein, it should be understood that other variations may be possible. Such variations are not to be regarded as a departure from the spirit and scope of embodiments of the present application, and all such modifications as would be obvious to one skilled in the art are intended to be included within the scope of the following claims.

What is claimed is:

1. A color unit comprising:
    a first p-type electrode layer disposed on a light receiving side of the color unit, and including a light-absorptive organic material which selectively absorbs a wavelength other than a desired wavelength in a visible light band of the electromagnetic spectrum;
    a second p-type electrode layer disposed under the first p-type electrode layer and including a light-absorptive organic material which absorbs a desired wavelength;
    an n-type electrode layer disposed under the second p-type electrode layer and including an organic material; and
    an exciton blocking layer configured to block excitons generated in the first p-type electrode layer from transferring to the second p-type electrode layer,
    wherein a band gap energy of the exciton blocking layer is at least 0.1 eV greater than a band gap energy of the first p-type electrode layer; and
    wherein photoelectric conversion is performed through a p-n junction between the second p-type electrode layer and the n-type electrode layer and light of the desired wavelength is converted into electrical current.

2. The color unit of claim 1, wherein the first p-type electrode layer and the second p-type electrode layer have a band gap energy of about 2.0 eV to about 3.5 9eV.

3. The color unit of claim 1, wherein the color unit is one of a red color unit which includes a first p-type electrode layer formed of a light-absorptive organic material which selectively absorbs a wavelength other than a wavelength corresponding to a red light region of the visible light band of the electromagnetic spectrum;
    a green color unit which includes a first p-type electrode layer formed of a light-absorptive organic material which selectively absorbs a wavelength other than a wavelength corresponding to a green light region of the visible light band of the electromagnetic spectrum; and
    a blue color unit which includes a first p-type electrode layer formed of a light-absorptive organic material which selectively absorbs a wavelength other than a wavelength corresponding to a blue light region of the visible light band of the electromagnetic spectrum.

4. The color unit of claim 3, wherein the red light region has a band gap energy of about 2.0 eV to about 2.2 eV, the green light region has a band gap energy of about 2.4 eV to about 2.5 eV, and the blue light region has a band gap energy of about 3.1 eV to about 3.2 eV.

5. The color unit of claim 1, wherein the exciton blocking layer is one of an exciton blocking layer which blocks a light having a wavelength less than about 600 nm and greater than about 500 nm, an exciton blocking layer which blocks a light having a wavelength less than about 500 nm and greater than about 400 nm, and an exciton blocking layer which blocks a light having a wavelength less than about 400 nm.

6. The color unit of claim 1, wherein the exciton blocking layer includes biphenyl trithiophene.

7. The color unit of claim 1, wherein the color unit is formed in a stacked structure of the first p-type electrode layer formed of P6T, the exciton blocking layer formed of BP3T, the second p-type electrode layer formed of CuPc and the n-type electrode layer formed of fullerene.

8. The color unit of claim 1, wherein the first p-type electrode layer includes phenyl hexathiophene.

9. The color unit of claim 1, wherein the second p-type electrode layer includes copper phthalocyanine, and the n-type electrode layer includes fulluerene.

10. The color unit of claim 1, further comprising at least one selected from the group consisting of:
    a first electrode layer disposed on the first p-type electrode layer;
    a hole transport layer disposed between the first electrode layer and the first p-type electrode layer;
    an intrinsic layer disposed between the second p-type electrode layer and the n-type electrode layer, wherein the intrinsic layer is formed by co-depositing a p-type organic material and an n-type organic material;
    a second electrode layer disposed under the n-type electrode layer; and
    a buffer layer disposed between the n-type electrode layer and the second electrode layer.

11. The color unit of claim 10, wherein the first electrode layer includes one selected from the group consisting of indium tin oxide, indium zinc oxide, ZnO, $SnO_2$, antimony-doped tin oxide, Al-doped zinc oxide, gallium-doped zinc oxide, $TiO_2$ and fluorine-doped tin oxide, and the second electrode layer includes one selected from the group consisting of Al, Cu, Ti, Au, Pt, Ag, Cr, indium tin oxide, indium zinc oxide, ZnO, $SnO_2$, antimony-doped tin oxide, Al-doped zinc oxide, gallium-doped zinc oxide, $TiO_2$ and fluorine-doped tin oxide.

12. The color unit of claim 10, wherein the hole transport layer includes polyethylene dioxythiophene/polystyrenesulfonic acid, the buffer layer includes 2,9-dimethyl-4,7-diphenyl-1,10-phenanthroline, and the intrinsic layer is formed by co-depositing CuPc and fullerene.

13. The color unit of claim 10, wherein the first electrode layer, the hole transport layer, the first p-type electrode layer, the exciton blocking layer, the second p-type electrode layer, the n-type electrode layer, the buffer layer and the second electrode layer are sequentially stacked from the light receiving side of the color unit.

14. The color unit of claim 13, the thickness of the hole transport layer is about 2~50 nm, the thickness of the first p-type electrode layer is about 80~250 nm, the thickness of the exciton blocking layer, the second p-type electrode layer, the intrinsic layer, and the n-type electrode layer is about 5~50 nm, respectively, the thickness of the buffer layer is about 1~20 nm, and the thickness of the first electrode layer and the second electrode layer is about 10~300 nm, respectively, and
    when the intrinsic layer is disposed between the second p-type electrode layer and the n-type electrode layer, the thickness of the first p-type electrode layer is greater as compared that the intrinsic layer is not disposed.

15. An imaging device comprising:

a light receiving part including a color unit comprising:

a first p-type electrode layer disposed on a light receiving side of the color unit, and including a light-absorptive organic material which selectively absorbs a wavelength other than a desired wavelength in a visible light band of the electromagnetic spectrum;

a second p-type electrode layer disposed under the first p-type electrode layer and including a light-absorptive organic material which absorbs a desired wavelength;

an n-type electrode layer disposed under the second p-type electrode layer and including an organic material; and an exciton blocking layer configured to block excitons generated in the first p-type electrode layer from transferring to the first p-type electrode layer and the second p-type electrode layer, wherein a band gap energy of the exciton blocking layer is at least 0.1 eV greater than a band gap energy of the first p-type electrode layer; and wherein photoelectric conversion is performed through a p-n junction between the second p-type electrode layer and the n-type electrode layer and light of the desired wavelength is converted into electrical current.

16. The imaging device of claim 15, which is a charge coupled device image sensor or a complementary metal oxide semiconductor image sensor.

17. The imaging device of claim 15, wherein the color unit comprises:

a first electrode layer formed at a light receiving side of the color unit and including at least one selected from the group consisting of indium tin oxide, indium zinc oxide, ZnO, $SnO_2$, antimony-doped tin oxide, Al-doped zinc oxide, gallium-doped zinc oxide, $TiO_2$ and fluorine-doped tin oxide;

an exciton blocking layer disposed between the first p-type electrode layer and the second p-type electrode layer, wherein the exciton blocking layer is configured to block the transfer of excitons generated in the first p-type electrode layer; and a second electrode layer disposed on a substrate and including at least one selected from the group consisting of ITO, IZO, ZnO, $SnO_2$, antimony-doped tin oxide, Al-doped zinc oxide, gallium-doped zinc oxide, $TiO_2$, fluorine-doped tin oxide, Al, Cu, Ti, Au, Pt, Ag and Cr.

18. The imaging device of claim 17, further comprising at least one selected from the group consisting of:

a hole transport layer including polyethylene dioxythiophene/polystyrenesulfonic acid disposed between the first electrode layer and the first p-type electrode layer;

a buffer layer including bathocuproin disposed between the n-type electrode layer and the second electrode layer; and an intrinsic layer formed by co-depositing a p-type organic material and an n-type organic material between the second p-type electrode layer and the n-type electrode layer.

19. The imaging device of claim 18, wherein the intrinsic layer is formed by co-depositing CuPc and fullerene.

* * * * *